United States Patent [19]

Larson et al.

[11] Patent Number: 4,812,687
[45] Date of Patent: Mar. 14, 1989

[54] DUAL DIRECTION INTEGRATING DELAY CIRCUIT

[75] Inventors: Tony R. Larson; Larry L. Tretter, both of Tucson, Ariz.

[73] Assignee: International Business Machines Corporation, Armonk, N.Y.

[21] Appl. No.: 218,728

[22] Filed: Jul. 13, 1988

[51] Int. Cl.⁴ .................... H03K 5/13; H03K 3/29; G05F 3/16

[52] U.S. Cl. .................... 307/601; 307/605; 307/290; 307/263; 307/265; 323/316

[58] Field of Search ............ 307/601, 602, 603, 605, 307/290, 246, 263, 265, 267, 268, 279; 328/58; 323/316

[56] References Cited

U.S. PATENT DOCUMENTS

| | | | |
|---|---|---|---|
| 3,473,050 | 10/1969 | Groom | 307/267 |
| 3,571,626 | 3/1971 | Reif | 328/58 |
| 3,906,247 | 9/1975 | Heffner | 307/601 |
| 3,985,970 | 10/1976 | Lerault et al. | 307/290 |
| 4,503,345 | 3/1985 | Yamamura | 307/601 |
| 4,580,065 | 4/1986 | Hague | 307/597 |
| 4,620,312 | 10/1986 | Yamashita | 307/603 |
| 4,675,546 | 6/1987 | Shaw | 307/265 |
| 4,717,843 | 1/1988 | Yoshimura | 307/605 |

FOREIGN PATENT DOCUMENTS

82/02805 8/1982 PCT Int'l Appl. ............ 323/316

Primary Examiner—Stanley D. Miller
Assistant Examiner—Trong Quang Phan

[57] ABSTRACT

A CMOS circuit that provides an output pulse having rising and falling edges that are delayed by predetermined different amounts from the rising and falling edges of an input pulse.

5 Claims, 3 Drawing Sheets

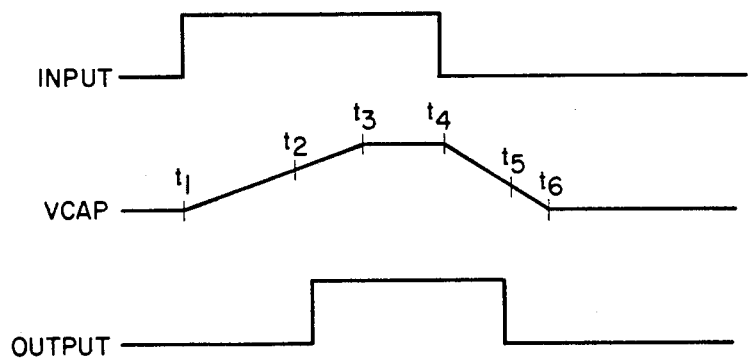

DUAL DIRECTION INTEGRATING DELAY CIRCUIT

BACKGROUND OF THE INVENTION

1. Field of the Invention

The present invention relates to integrated circuit technology wherein it is desirable to provide an output pulse having rising and falling edges that are independently delayed by predetermined different amounts from the rising and falling edges of an input pulse. More particularly, the invention concerns an improved, low cost CMOS circuit for providing such a function.

2. Discussion of Related Art

Various transistor circuits exist in the prior art that are capable of programmable pulse generation. For example, U.S. Pat. No. 3,906,247 describes a programmable proportional clock edge delay circuit. The patented circuit provides independent control over the rising and falling edges of an output circuit by means of a voltage comparator that requires ramp generator control means to initiate successive clock pulses for alternately initiating and terminating the ramp voltage generation. It is not clear, however, how such a circuit could be implemented in CMOS technology; nor is the circuit of the same speed and operational efficiency as Applicants' claimed invention.

U.S. Pat. No. 4,580,065 describes an integrated circuit single shot generator for providing a desired duty cycle. However, the circuit does not disclose a technique for establishing independent control of rising and falling edges of an input signal.

U.S. Pat. No. 4,675,546 discloses an edge programmable timing signal generator which is completely implemented in digital logic configuration. However, the circuitry involved is much more complicated than that described in Applicants' specification.

SUMMARY OF THE INVENTION

The present invention provides an analog CMOS circuit capable of producing an output pulse having rising and falling edges that can be independently delayed from the rising and falling edges of an input pulse. Generally, the circuit function is accomplished by a charging capacitor driving a Schmitt trigger. The charge on the capacitor is determined by a first constant current source and switch responsive to the rising edge of the input pulse, and a second constant current source and switch responsive to the falling edge of the input pulse. The circuit is configured in CMOS technology with a low number of components.

The foregoing and other objects, features and advantages of the invention will be apparent from the following more particular description of a preferred embodiment of the invention, as illustrated in the accompanying drawings.

BRIEF DESCRIPTION OF THE DRAWINGS

The foregoing features of the invention are attained in the preferred embodiment that is described in the accompanying drawings wherein:

FIG. 2 comprises a wave form that is helpful in understanding the operation of the circuit of FIG. 1;

DETAILED DESCRIPTION OF THE INVENTION

Figure 1:
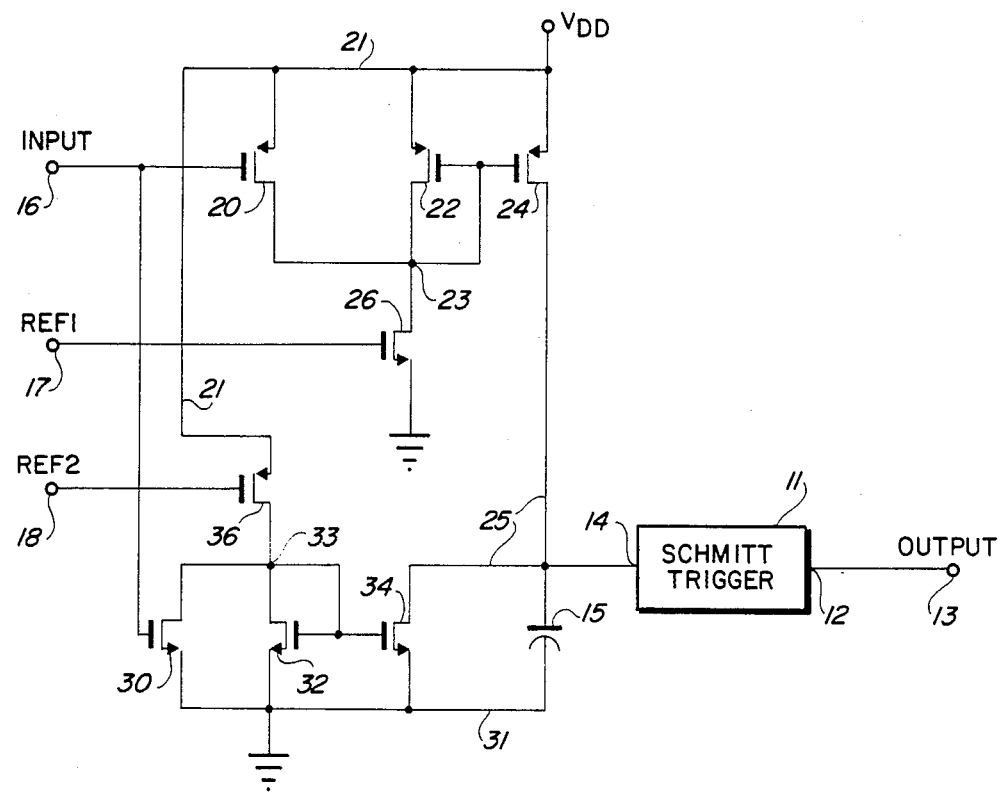
FIG. 1 comprises a schematic drawing of a preferred embodiment of the invention.

Referring now to the drawings, and particularly to FIG. 1, a detailed description of a preferred embodiment of the invention is described, including a Schmitt trigger 11 having an output 12 associated with a circuit output terminal 13 and an input 14 connected to one terminal of a capacitor 15.

The Schmitt trigger is of conventional design and, in the usual fashion, provides a low state output signal when its input receives a voltage input equal to or less than a low voltage trigger value, and a high state output signal when its input receives a voltage input equal to or higher than a high trigger value. For input voltages between the low trigger value and the high trigger value, the Schmitt trigger remains in an unswitched condition.

Referring to the left side of FIG. 1, an input terminal 16 is provided along with reference terminals 17, 18. Input terminal 16 is connected to the gate of a P channel enhancement device 20 and to the gate of an N channel enhancement device 30. The source of device 20 is connected via a conductor 21 to a positive voltage source $v_{dd}$ which may comprise a positive voltage source of about +5 volts suitable for chip operation. In similar fashion, the source of device 30 is connected via a conductor 31 to ground. The substrate connections for all N channel devices is ground and for all P channel devices is $v_{dd}$.

The drain of device 20 is connected to a node 23. Another P channel device 22 is provided, having its source connected to conductor 21 and source $v_{dd}$, and its drain connected to node 23. A P channel device 24 is provided, having its source connected to source $v_{dd}$ via conductor 21, and having its drain connected to capacitor 15 and the input of the Schmitt trigger by a conductor 25. The gates of devices 22, 24 are connected together and to node 23.

An N channel enhancement device 26 is provided, having its gate connected to reference terminal 17, its drain connected to node 23 and its source connected to ground.

Referring to the bottom half of FIG. 1, the drain of device 30 is connected to a node 33. Reference input terminal 18 is connected to the gate of a P channel device 36, having its drain connected to node 33 and its source connected to $v_{dd}$ via conductor 21.

Another N channel device 32 is provided, having its source connected to ground and its drain connected to node 33. Yet another N channel device 34 is provided, having its source connected to ground and having its drain connected via connector 25 to capacitor 15 and the input 14 of Schmitt trigger 11. The gate of device 32 is connected to the gate of device 34 and to node 33. The other terminal of capacitor 15 is connected to ground via connector 31.

As configured, P channel enhancement device 20 acts as a switch associated with a constant current source comprising device 26 and devices 22, 24 operating as a current mirror circuit In similar fashion, N channel enhancement device 30 operates as a switch associated with a constant current source comprised of device 36 and devices 32, 34 operated as a current mirror.

In operation, if the input to terminal 16 is zero volts (or a logic "zero") then the P channel enhancement device 20 is turned on and the N channel enhancement device 30 is turned off. This means that the voltage across device 20 will be less than a few tenths of a volt, which disables the current mirror 22, 24. Because device 30 is turned off, the current mirror 32, 34 is allowed to function. With device 24 off and device 34 conducting mirror current, the charge is removed from capacitor 15 which in turn will discharge capacitor 15 to ground level.

If, on the other hand, the input voltage goes to five volts (a logic "1"), this will turn off device 20 and turn on device 30. Such circuit action in turn disables current mirror 32, 34 and enables current mirror 22, 24. When device 24 conducts capacitor 15 receives charge from $v_{dd}$ and charges up in a ramp function, as illustrated in FIG. 2. The rate of charge up is a function of current through device 24. When the capacitor voltage exceeds the upper trip point of the Schmitt trigger, the Schmitt trigger output will go high.

As the capacitor voltage approaches $v_{dd}$, i.e. five volts, the current through device 24 will be reduced to zero. Consequently, the voltage of capacitor 15 will stabilize at the value of $v_{dd}$.

When the input voltage returns to zero volts, i.e. a logic zero, device 20 is turned on and current mirror 22, 24 is disabled again. At the same time, device 30 is turned off and current mirror 32, 34 is enabled. Consequently, the value of capacitor voltage declines from $v_{dd}$ and ramps down toward ground. The rate of discharge is a function of current through device 34. When the capacitor voltage goes below the lower trip point of the Schmitt trigger, its output will go low. As the capacitor voltage reaches a value near zero, the current flow through device 34 will be reduced to zero, and the capacitor voltage will stabilize near a ground level.

Referring to FIG. 2, the timing for the operation of the ramp up and ramp down circuits is specifically illustrated. For example, at T1 the voltage on capacitor 15 is zero and the input voltage has switched from a logic "zero" to a logic "one" condition. At this time, the output of the Schmitt trigger is in a low state. The capacitor voltage charges to the upper trip point of the Schmitt trigger at time T2. Consequently, the output of the Schmitt trigger changes to a high level at that point. The capacitor voltage continues to charge to a full five volts at time T3 and stabilizes at that point until time T4. At T4, the input signal to the circuit goes to a logic low condition, or zero volts. Consequently, the circuit operates to discharge capacitor 15 until at a time T5 capacitor voltage reaches the low trigger point of the Schmitt trigger. At that time, the output level of the Schmitt trigger returns to a low state. The capacitor continues to discharge until time T6 at which time it reaches a zero level where it remains until the input voltage is returned to a high state.

By varying the width to length ratio of device 24 with respect to device 22, the value of the charge-up current can be controlled. Also, by varying the width to length ratio of device 34 with respect to device 32, the value of the discharge current can be controlled.

Figure 3A:
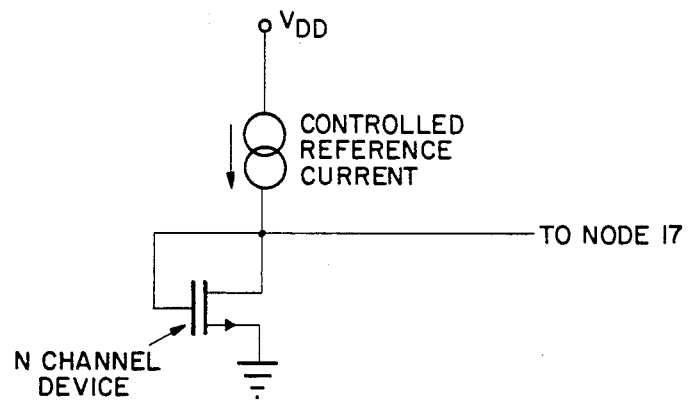
FIG. 3a is a schematic of a current mirror used with the circuit of FIG. 1.

The value of the charge up current can also be controlled by the voltage applied at input 17. Higher values of applied voltage result in larger charge up currents and, consequently, shorter ramp up times. The voltage at input 17 is typically developed by a current mirror as shown in FIG. 3a.

Figure 3B:
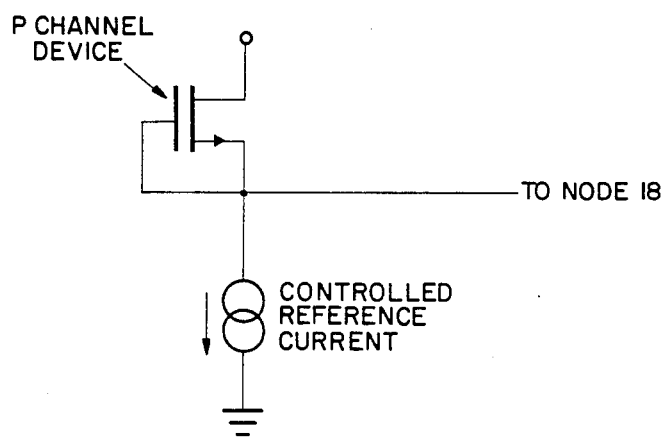
FIG. 3b is a schematic of another current mirror used with the circuit of FIG. 1.

Similarly the value of the charge down current can be controlled by the voltage applied at input 18. Lower values of applied voltage result in larger charge down currents and, consequently, shorter ramp down times. The voltage at input 18 is typically developed by a current mirror as shown in FIG. 3b.

The ramp times may be programmed independently by varying either the controlled reference currents or the mirror device width/length ratios.

The Schmitt trigger is used in the circuit to give a larger dynamic range to the detection of the change in the voltage across the capacitor, and to increase the noise immunity to noise on the voltage capacitor.

The circuit lends itself to production of an output pulse which has rising and falling edges that are independently variable with respect to the rising and falling edges of an input pulse, which function is useful in CMOS circuitry. The configuration of the circuit, as illustrated, is comprised of a relatively low number of components and is reliable and inexpensive to fabricate in conventional CMOS technology. It should be understood that N and P channel enhancement devices are illustrated in this embodiment. However, the device could be constructed as well with some depletion mode devices, if desired, provided that devices 20 and 30 remain as enhancement mode devices.

While the invention has been particularly shown and described with reference to a preferred embodiment thereof, it will be understood by those skilled in the art that various changes in form and details may be made therein without departing from the spirit and scope of the invention.

What is claimed is:

1. A CMOS circuit comprising:
   first and second interconnected FET devices switchable between complementary on and off states in response to the leading and trailing edges of an input pulse;
   first and second FET current mirrors connected to, respectively, said first and second FET devices, switchable between active and inactive states;
   voltage charging means connected to reference voltages and said first and second current mirrors whereby the voltage charging means receives charge during an active state of said first current mirror and loses charge during an active state of said second current mirror; and
   voltage responsive means connected to said charging means for providing a first output signal when the voltage of the charging means exceeds a predetermined level and a second output signal when the voltage on said charging means is below another predetermined level.

2. The CMOS circuit of claim 1 wherein said voltage responsive means comprise a Schmitt trigger circuit.

3. The CMOS circuit of claim 1 wherein said first and second FET devices are P and N channel devices.

4. The CMOS circuit of claim 3 wherein the first and second FET current mirrors are comprised of P and N channel devices.

5. The circuit of claim 2 wherein said voltage charging means comprises a capacitor having an input connected as an input to the Schmitt trigger.

* * * * *